(12) United States Patent
Hwang et al.

(10) Patent No.: US 8,295,419 B2
(45) Date of Patent: Oct. 23, 2012

(54) METHOD AND APPARATUS FOR GENERATING SYNCHRONIZATION SIGNALS FOR SYNCHRONIZING MULTIPLE CHIPS IN A SYSTEM

(75) Inventors: Charlie C. Hwang, Hopewell Junction, NY (US); Wiren D. Becker, Hyde Park, NY (US); Timothy G. McNamara, Fishkill, NY (US); Ching-Lung Tong, Highland Mills, NY (US)

(73) Assignee: International Business Machines Corporation, Armonk, NY (US)

( * ) Notice: Subject to any disclaimer, the term of this patent is extended or adjusted under 35 U.S.C. 154(b) by 22 days.

(21) Appl. No.: 12/906,658

(22) Filed: Oct. 18, 2010

(65) Prior Publication Data

US 2011/0033017 A1 Feb. 10, 2011

Related U.S. Application Data

(60) Division of application No. 11/363,871, filed on Feb. 28, 2006, now Pat. No. 7,826,579, which is a continuation-in-part of application No. 11/056,767, filed on Feb. 11, 2005, now Pat. No. 7,382,844.

(51) Int. Cl.
*H04L 7/00* (2006.01)
(52) U.S. Cl. ........ 375/354; 375/357; 375/362; 375/365; 375/368; 375/371; 375/373; 375/376
(58) Field of Classification Search .................. 375/354, 375/362, 355, 368, 373, 376; 327/52, 200; 365/203, 205; 713/401, 500, 600
See application file for complete search history.

(56) References Cited

U.S. PATENT DOCUMENTS

| | | | |
|---|---|---|---|
| 5,850,414 A | 12/1998 | Miyajima | |
| 5,995,570 A * | 11/1999 | Onvural et al. | 375/356 |
| 6,470,458 B1 | 10/2002 | Dreps et al. | |
| 6,665,359 B1 | 12/2003 | Flake | |
| 6,751,248 B1 | 6/2004 | Tan | |
| 6,792,554 B2 | 9/2004 | Gervais et al. | |
| 6,819,726 B2 | 11/2004 | Drerup et al. | |
| 7,065,168 B2 * | 6/2006 | Dedic et al. | 375/354 |
| 7,098,707 B2 * | 8/2006 | Starr et al. | 327/147 |
| 7,174,475 B2 | 2/2007 | Lee et al. | |
| 2003/0091137 A1 | 5/2003 | Vallet et al. | |

* cited by examiner

*Primary Examiner* — Dhaval Patel
(74) *Attorney, Agent, or Firm* — Cantor Colburn LLP; William A. Kinnaman, Jr.

(57) ABSTRACT

A clock generator circuit for generating synchronization signals for a multiple chip system. The clock generator circuit comprises generation of a synchronization signal from a reference clock and chip global clock with edge detection logic. In high performance server system design with multiple chips, a common practice for server systems is to use feedback clock and delayed reference clock to generate the synchronization signal. The generated synchronization signal is transferred to latches clocked by the global clock to be used for chip synchronization functions. As the system clock frequency is pushed higher, the phase difference between generated synchronization signal clocked by feedback clock and receiving latch clocked by global clock is becoming such a large portion of cycle time that this signal cannot be transferred deterministically. This invention resolves the uncertainty problem and allows the synchronization signals to be generated deterministically independent of the chip global clock cycle time.

11 Claims, 11 Drawing Sheets

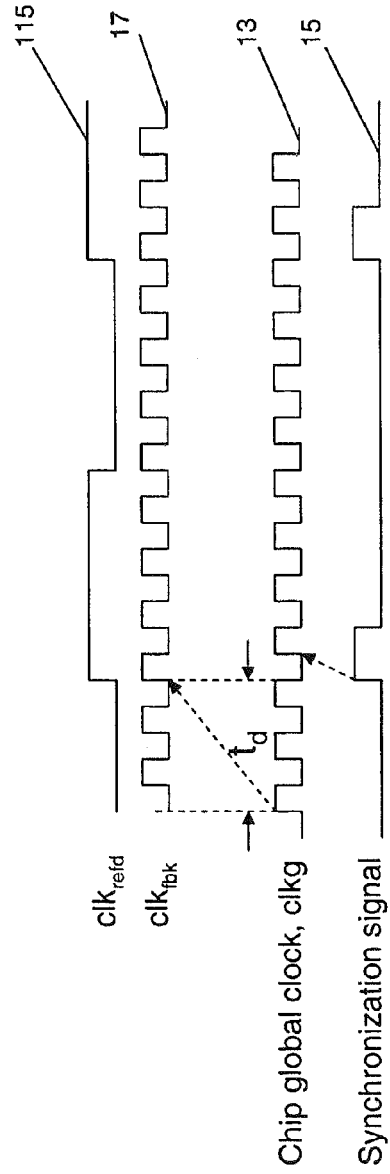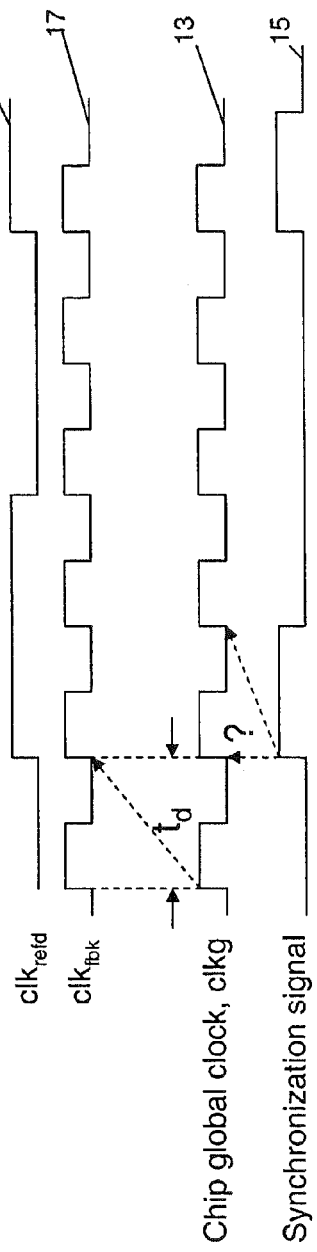
Figure 6a:
when td is larger than one minimum clkg cycle
Figure 6b
when td is unchanged from figure 6a, but clkg cycle time increases

METHOD AND APPARATUS FOR GENERATING SYNCHRONIZATION SIGNALS FOR SYNCHRONIZING MULTIPLE CHIPS IN A SYSTEM

CROSS-REFERENCE TO RELATED APPLICATIONS AND PRIORITY CLAIM

This application is a divisional of and claims priority to U.S. Non-provisional application Ser. No. 11/363,871, entitled "METHOD AND APPARATUS FOR GENERATING SYNCHRONIZATION SIGNALS FOR SYNCHRONIZING MULTIPLE CHIPS IN A SYSTEM", filed Feb. 28, 2006, now U.S. Pat. No. 7,826,579, which is a continuation in part of U.S. Non-provisional application Ser. No. 11/056,767, entitled "METHODS TO SELF-SYNCHRONIZE CLOCKS ON MULTIPLE CHIPS IN A SYSTEM" filed Feb. 11, 2005, now U.S. Pat. No. 7,382,844, both of which applications are hereby incorporated herein by reference in their entirety.

BACKGROUND

1. Field of the Invention

This invention relates to methods to self-synchronize clocks on multiple chips in a system.

2. Description of Background

In a synchronous digital system comprised of multiple chips with synchronous communications among them, cross-chip functions often require a synchronized "time-zero" over a certain predefined number of clock cycles. To properly synchronize the time-zero of all the chips in the same system, a method is required to synchronize the counters that keep track of the "time-zero" on all the chips. One way to accomplish this is through the methods described in patent application Ser. No. 11/056,767, Methods to Self-synchronize Clocks on Multiple Chips in a System. All of the synchronization methods described therein rely on a synchronization signal generated off of the input reference clock and a PLL-generated global clock of the chip. This is as shown in the example in FIG. 1. These signals include a reference clock signal, $clk_{ref}$ 11, a chip global clock signal, clkg 13, and a synchronization signal 15.

SUMMARY OF THE INVENTION

The generation of the synchronization signal from the reference clock and chip global clock may be done with edge detection logic at a slower frequency. In high performance server system designs desk with multiple chips, a common practice for server systems is to use a feedback clock, $clk_{fbk}$ 17, and a delayed reference clock, $clk_{refd}$ 18, to generate the synchronization signal as shown in FIG. 2. This is because the phases of these two clocks are known to align well to each other. The synchronization generation logic may be embedded in the PLL (phase locked loop) 25 design to work with other aspects of PLL functions. Phase locked loop 25 provides an input to a global clock generation circuit 27 for generating global clock 13. The feedback clock path includes a mimic receiver 33 (mimicking the receiver 21 driven by reference clock 11), mimic logic circuitry 35 (mimicking the logic circuitry 23 driven by receiver 21), and a mimic local clock buffer 37 (mimicking a local clock buffer 29). The purpose of these mimic circuits is to align the phase of a local clock buffer 29 output, cl, to the phase of input reference clock 11. The parentheses in FIG. 2 indicate the relative timing to input reference clock 11 at different nodes. By doing so, all the chips in the same system receiving reference clocks with the same phase will have cl clocks, which clock latches 31, phase-aligned to each other. This reduces timing uncertainty in cross-chip communication systems.

A synchronization signal generation circuit 24 is clocked by feedback clock, $clk_{fbk}$ 17. The generated synchronization signal 15 has to be eventually transferred to latches clocked by the global clock, clkg 13, to be used for chip synchronization functions. The phase mismatch of feedback clock, $clk_{fbk}$ 17, and clkg 13 is equal to the delay of mimic receiver 33, mimic logic circuitry 35, and mimic local clock buffer 37 (dr+dl+db). When the clock cycle time is long compared to $t_d$=dr+dl+db, this extra delay is not a concern for transferring a synchronization signal 15 to a first latch (latch 1) 38 (FIG. 3). As the system clock frequency is pushed higher and higher, however, the phase mismatch, dr+dl+db, doesn't scale proportionally and becomes a larger and larger portion of the clkg 13 cycle time.

In current generation high performance systems, this phase mismatch approaches the chip cycle time, so the synchronization signal 15 cannot be properly transferred from the synchronization signal generation circuit 24 clocked by the feedback clock 17 to the chip logic running on chip global clock 13 without uncertainty.

As shown in FIG. 3, when the total delay of the mimic circuitry in FIG. 2, $t_d$, is close to one clkg cycle, there won't be enough time, $t_{tr}$, for the synchronization signal 15 to be transferred to the first latch (latch 1) 38. If $t_d$ is larger than one clkg 13 cycle, we cannot be certain at which clkg 13 cycle latch 1 receives the synchronization signal 15, especially if the system may be run at frequencies slower than the maximum target frequency, as will be discussed in detail below.

This invention resolves the uncertainty problem and allows the synchronization signals to be generated deterministically independent of the chip global clock cycle time.

Embodiment I

Referring to FIG. 4, when $t_d$, the phase difference between the feedback clock, $clk_{fbk}$ 17, and the chip global clock, clkg 13, is around one clkg cycle and smaller than 1.5 clkg cycles, the first latch (latch 1) 38 that receives the synchronization signal 15 from synchronization signal generation circuit 24 is clocked by an inverted feedback clock $clk_{fbk}$ 117 instead of the regular global clock, clkg. A second latch (latch 2) 40 clocked by chip global clock, clkg, 13, is placed near the first latch 38 to receive and send out the synchronization signal 15. This approach effectively gives the first path between the synchronous signal generation circuit 24 and the first latch 38 another 0.5 clkg cycle to transfer the synchronous signal.

Embodiment II

When $t_d$ is more than 1.5 times the minimum global clock cycle time, even the approach used by embodiment I is not adequate to receive the synchronization signal at the second latch 40, clocked by clkg 13, without uncertainty. Because if the chip could run at a slower frequency than the maximum frequency, the cycle relative to clkg 13 in which the synchronization signal is latched may be uncertain as the chip slows down and the mimic circuitry delay, $t_d$, is close to an integral multiple of a slowed down clkg cycle time. The solution proposed (as shown, for example, in FIG. 7) is to:

a) Intentionally place the mimic receiver 33 and the mimic local clock buffer 37 at the beginning of the feedback path.

b) Use the delayed global clock cld from the output of the mimic receiver 33/local clock buffer 37 combination and the reference clock $clk_{refd0}$ from the output of the receiver 21 to generate the synchronization signal 15.

b) Use the delayed clkg 13 from the output of mimic receiver 33/local clock buffer 37 combination and the reference clock from the output of the receiver to generate the synchronization signal.

Additional features and advantages are realized through the techniques of the present invention. Other embodiments and aspects of the invention are described in detail herein and are considered a part of the claimed invention. For a better understanding of the invention with advantages and features, refer to the description and to the drawings.

As a result of the summarized invention, technically we have achieved a solution which resolves clock signal uncertainty and facilitates the synchronization signals being generated deterministically independent of the chip global clock cycle time.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

FIG. 6 illustrates one example of the timing relationship of the global clock and feedback clock when $t_d$ is larger than one minimum global clock cycle.

The detailed description explains the preferred embodiments of the invention, together with advantages and features, by way of example with reference to the drawings.

DETAILED DESCRIPTION OF THE INVENTION

Embodiment I

Figure 1:
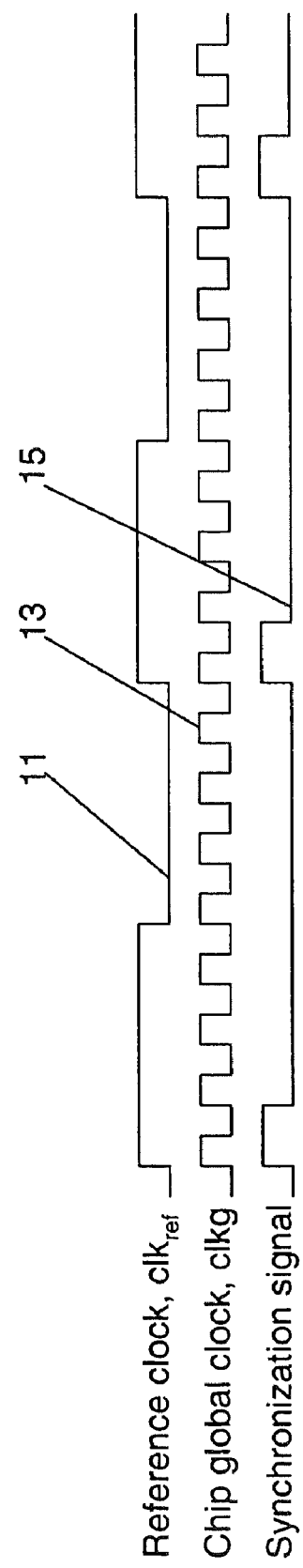
FIG. 1 illustrates one example of a synchronization signal, with a PLL multiplication ratio of 8.
Figure 2:
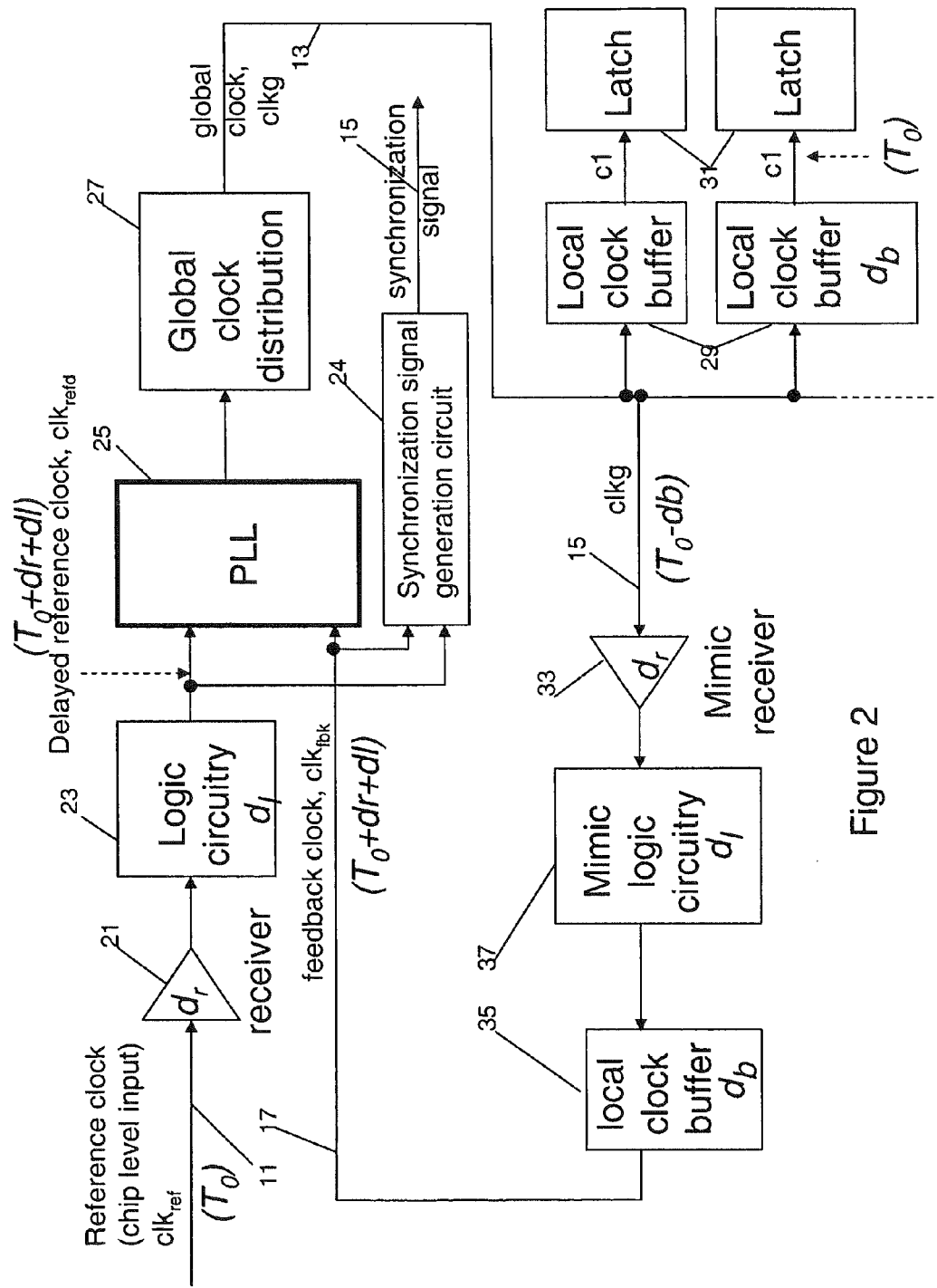
FIG. 2 illustrates one example of synchronization signal generation with a delayed reference clock and feedback clock.
Figure 3:
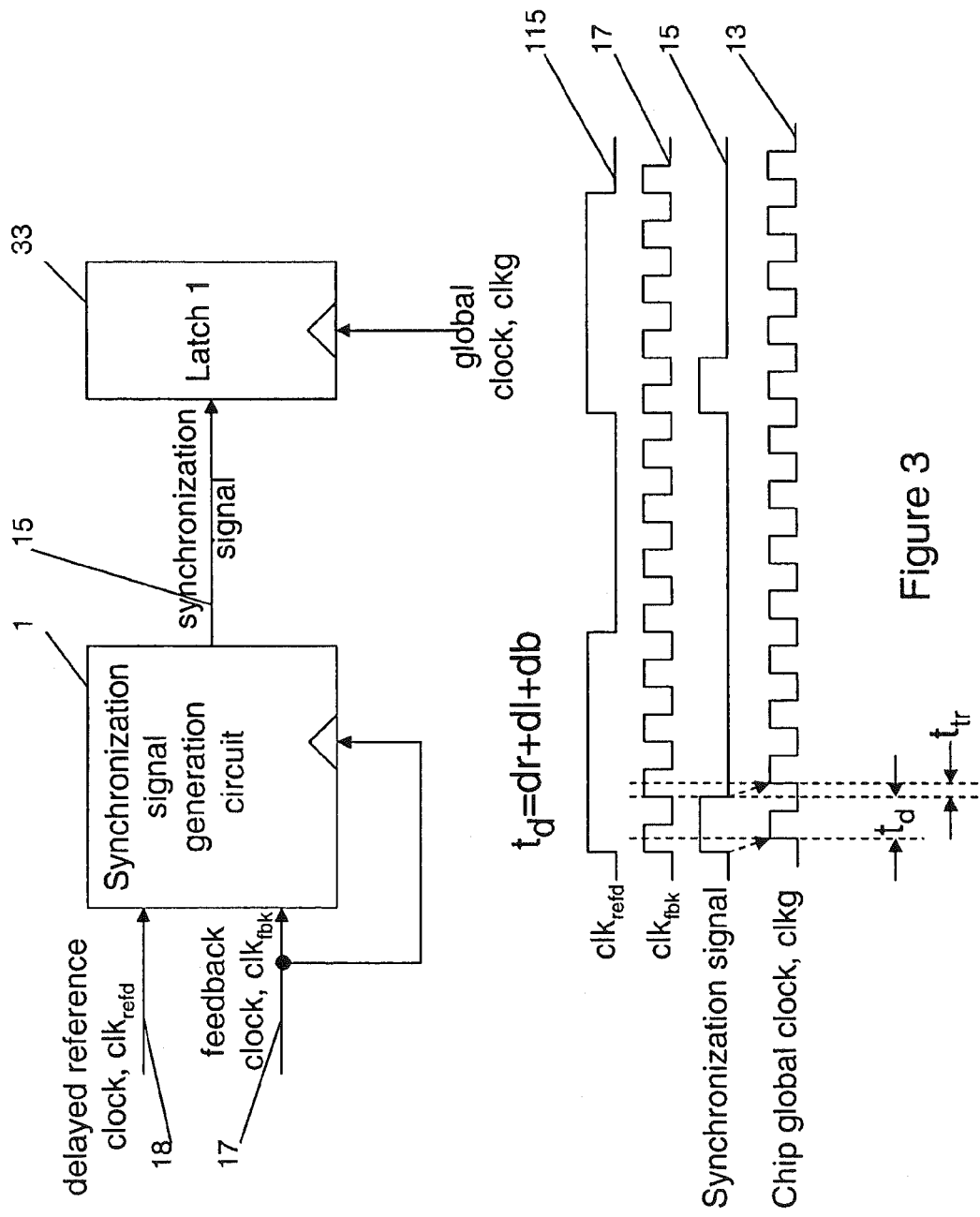
FIG. 3 illustrates one example of data transfer from a synchronization circuit to a first latch.
Figure 4:
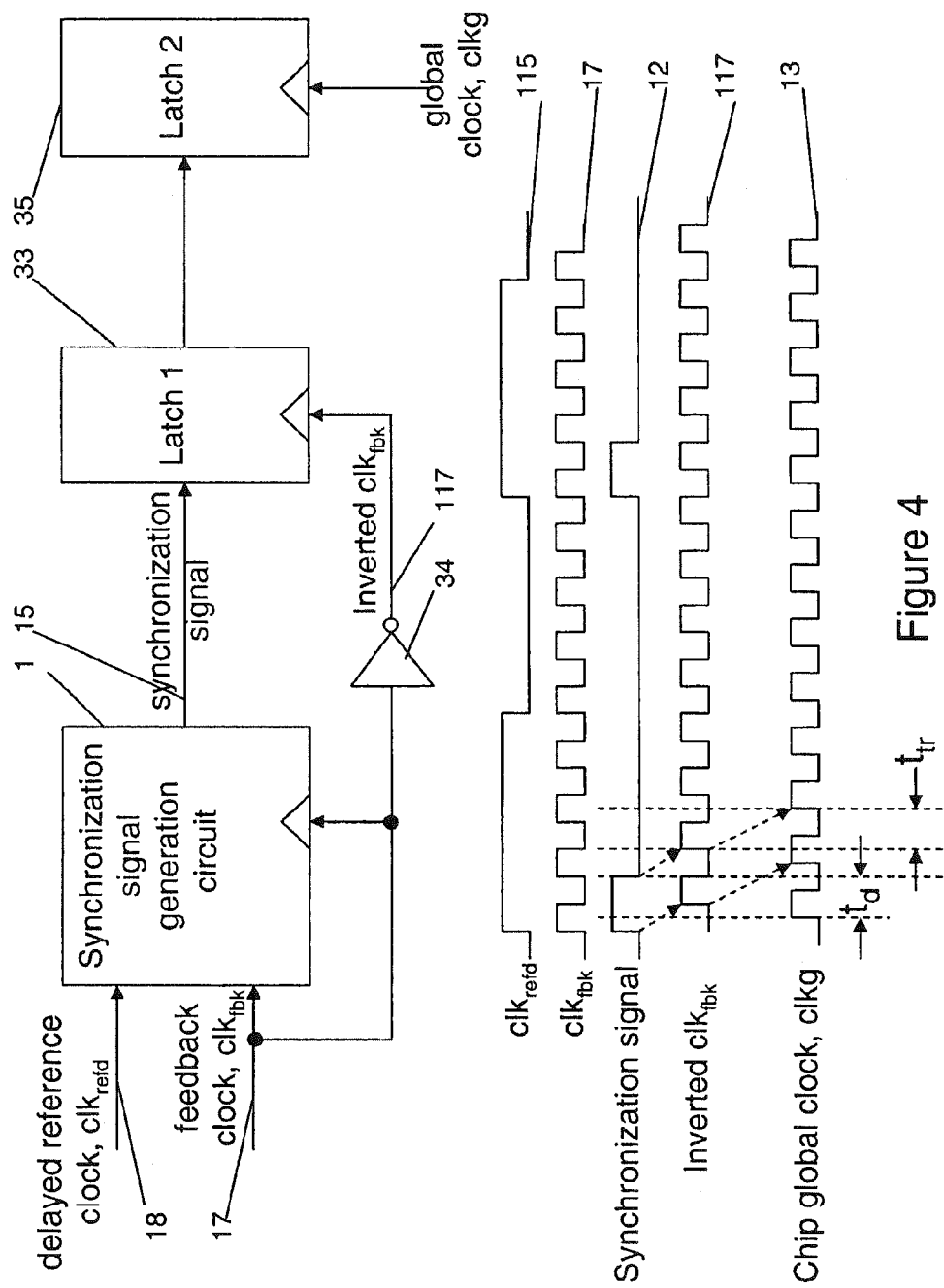
FIG. 4 illustrates one example of using an inverted feedback clock to clock the first latch.

Referring to FIG. 4, when the delay of the mimic circuitry is around 1 clkg cycle but less than 1.5 clkg cycles, the first latch (latch 1) 38 to receive the synchronization signal 15 is placed close to the synchronization signal generation circuit 24. The feedback clock $clk_{fbk}$ 17 is inverted by an inverter 32 and an inverted feedback clock $clk_{fbk}$ 117 used to clock latch 1 as shown in the figure. The output 15 from the synchronization signal generation circuit 24 is still launched with feedback clock $clk_{fbk}$ 17. Effectively, this scheme borrows 0.5 clkg cycle from the next path between the first latch (latch 1) 38 and the second latch (latch 2) 40, so latch 1 to latch 2 becomes a half-cycle path. In physical design, latch 2 also needs to be placed close to latch 1 to allow the half-cycle path.

Figure 5A:
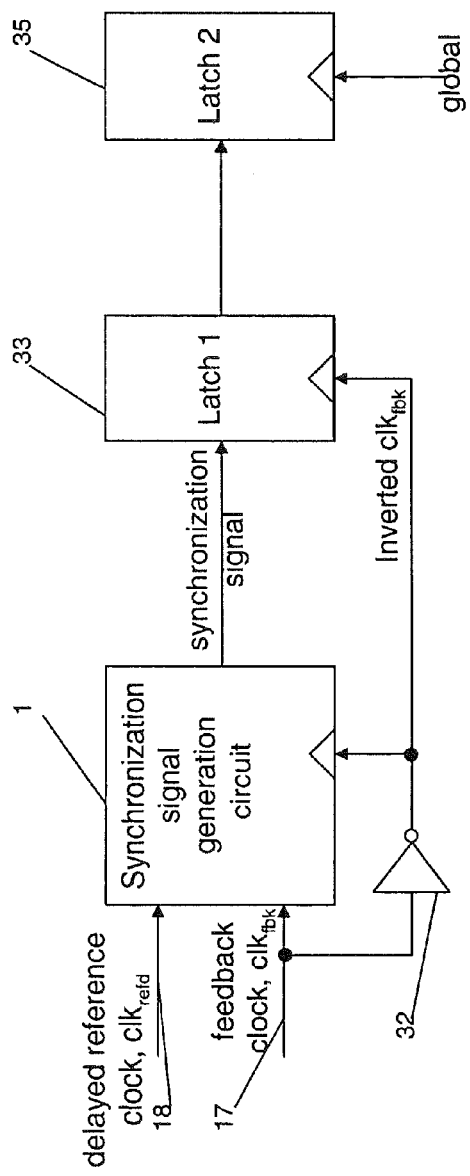
FIGS. 5a and 5b illustrate examples of two synchronization signal generation circuits clocked by an inverted feedback clock with optional combination logic.
Figure 5B:
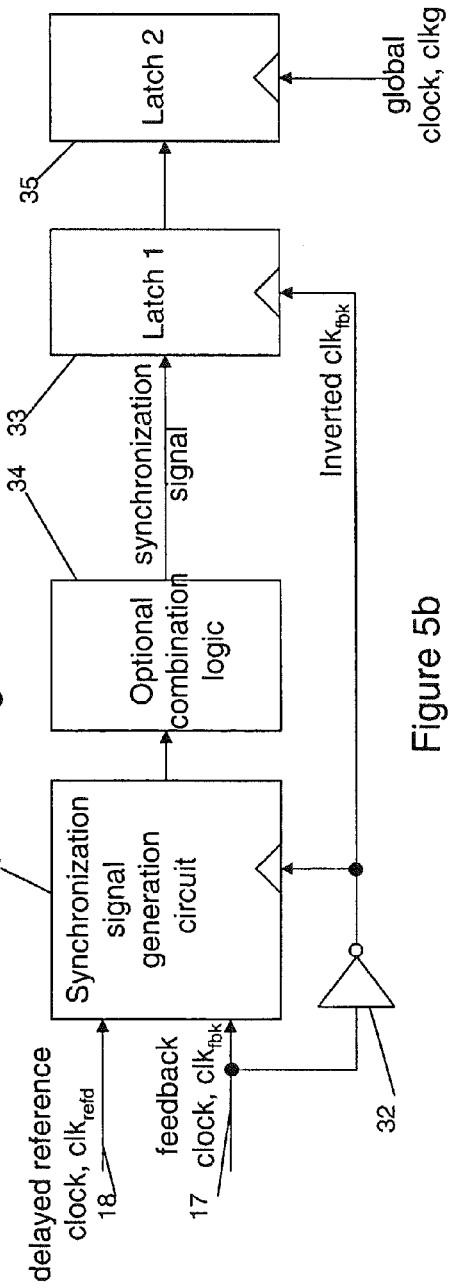

Other variations to this scheme include using the inverted feedback clock 117 to clock the synchronization signal generation circuit 24 as shown in FIGS. 5a and 5b. By doing so, the path between the launching latches and latch 1 receives one full cycle for signal transfer. This allows additional combinational logic to be added to the path for other functions.

Embodiment II

When, $t_d$ is more than 1.5 times of the minimum global clock cycle time, even the approach used by embodiment I is not adequate to receive the synchronization signal at the second latch 40, clocked by clkg 13, without uncertainty. When the chip runs at a slower frequency than the maximum frequency, the cycle relative to clkg 13 in which the synchronization signal is latched at latch 2 may become uncertain if the mimic circuitry delay, $t_d$, is close to an integral multiple of a slowed down clkg cycle time as shown in FIGS. 6a and 6b. It is critical that the method used will operate at the maximum frequency and any frequency that is slower than the design frequency. In today's modern processors, the frequency of operation is often slowed down to save power, to prevent overheating, for speed sorting, or for testing. The system must continue to function under these slower frequencies.

Figure 7:
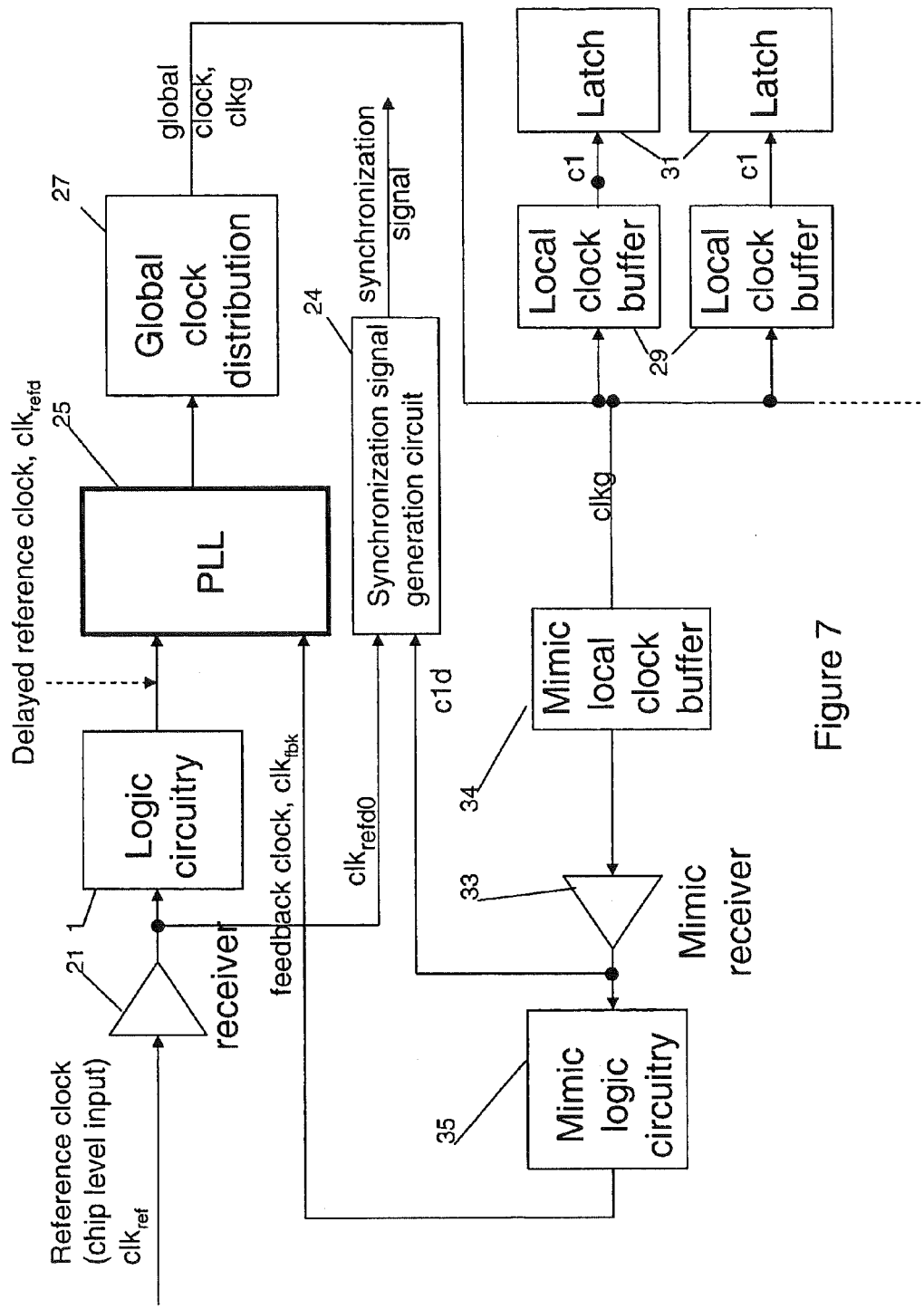
FIG. 7 illustrates one example of synchronization signal generation with a reference clock and delayed global clock at the receiver output.

To make the design frequency independent, we'll need to generate the synchronization signal with two other clock sources that do not have large phase misalignment with the global clock, clkg. An ideal source will be the reference clock $clk_{refd0}$ (FIG. 7) at the output of the receiver 21, since its phase only differs from that of clkg by db+dr. This effectively removes dl, in general the larger portion of mimic circuitry delay, from the phase mismatch. One workable arrangement is to:

a) Intentionally place the mimic receiver 33 and the mimic local clock buffer 37 at the beginning of the feedback path.

b) Use the delayed clkg (cld) from the output of the mimic receiver/local clock buffer combination and the reference clock $clk_{refd0}$ from the output of the receiver 21 to generate the synchronization signal as shown in FIG. 7.

Figure 8:
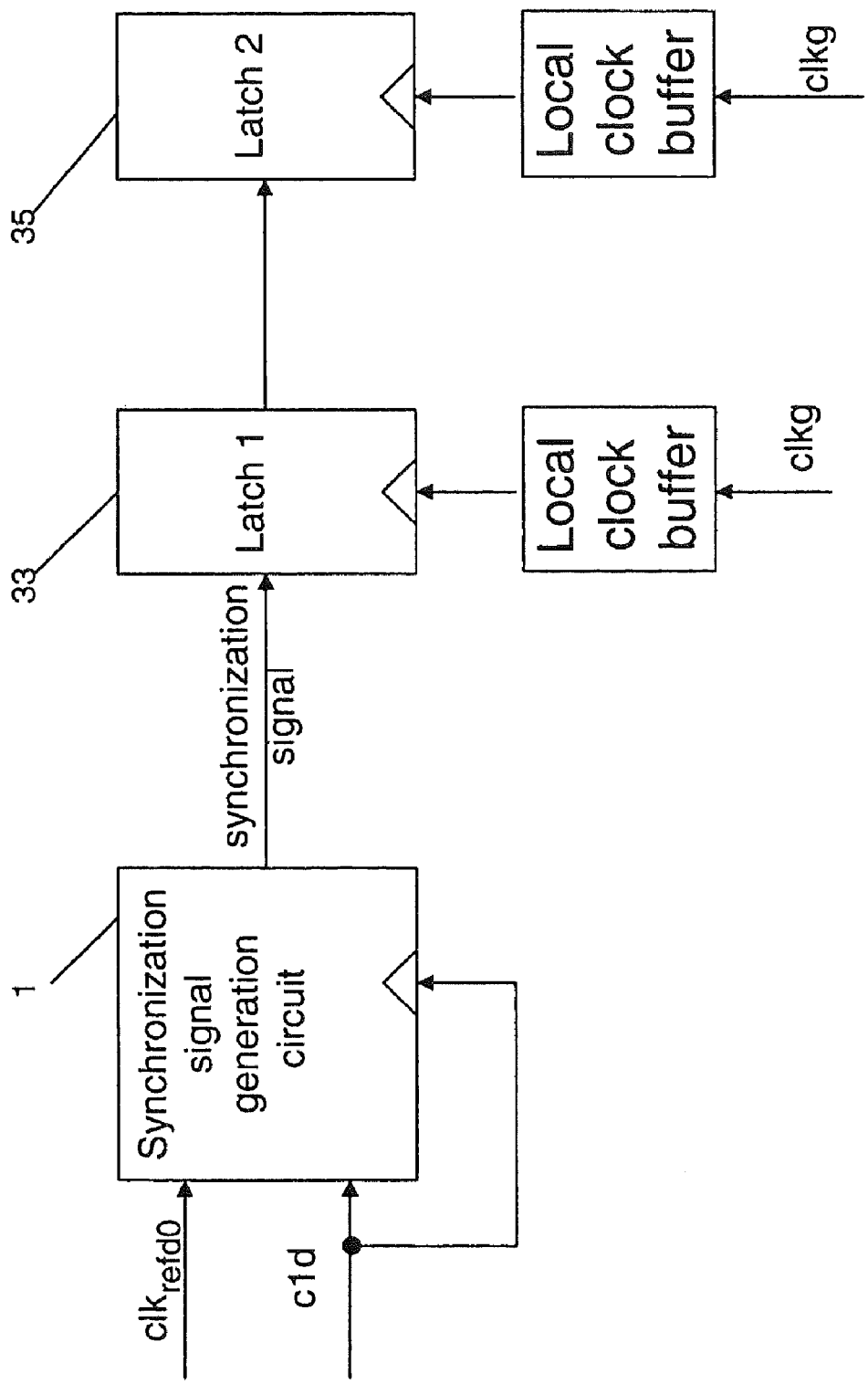
FIG. 8 illustrates one example of synchronization signal transfer with optional local clock buffers.

The phase mismatch between cld and clkg, dr+db, in general is usually small compared to clkg cycle time. To further reduce the mismatch, one can use cld to launch the synchronization signal 15 from the synchronization signal generation circuit 24 and add local clock buffers 42 for latches 38, 40 at downstream locations as shown in FIG. 8. This will cut the phase mismatch to only dr.

This embodiment can further be combined with embodiment I. If the remaining phase mismatch, dr, ever becomes a large portion of the clkg cycle time, one may use the technique described in embodiment I to gain half of clkg cycle for the path between the synchronization signal generation circuit 24 and latch 1 as shown in FIGS. 5a and 5b, where FIGS. 5a and 5b illustrate examples of two synchronization signal generation circuits 24 clocked by inverted feedback clock 117 with optional combination logic 34 in FIG. 5b.

Figure 9:
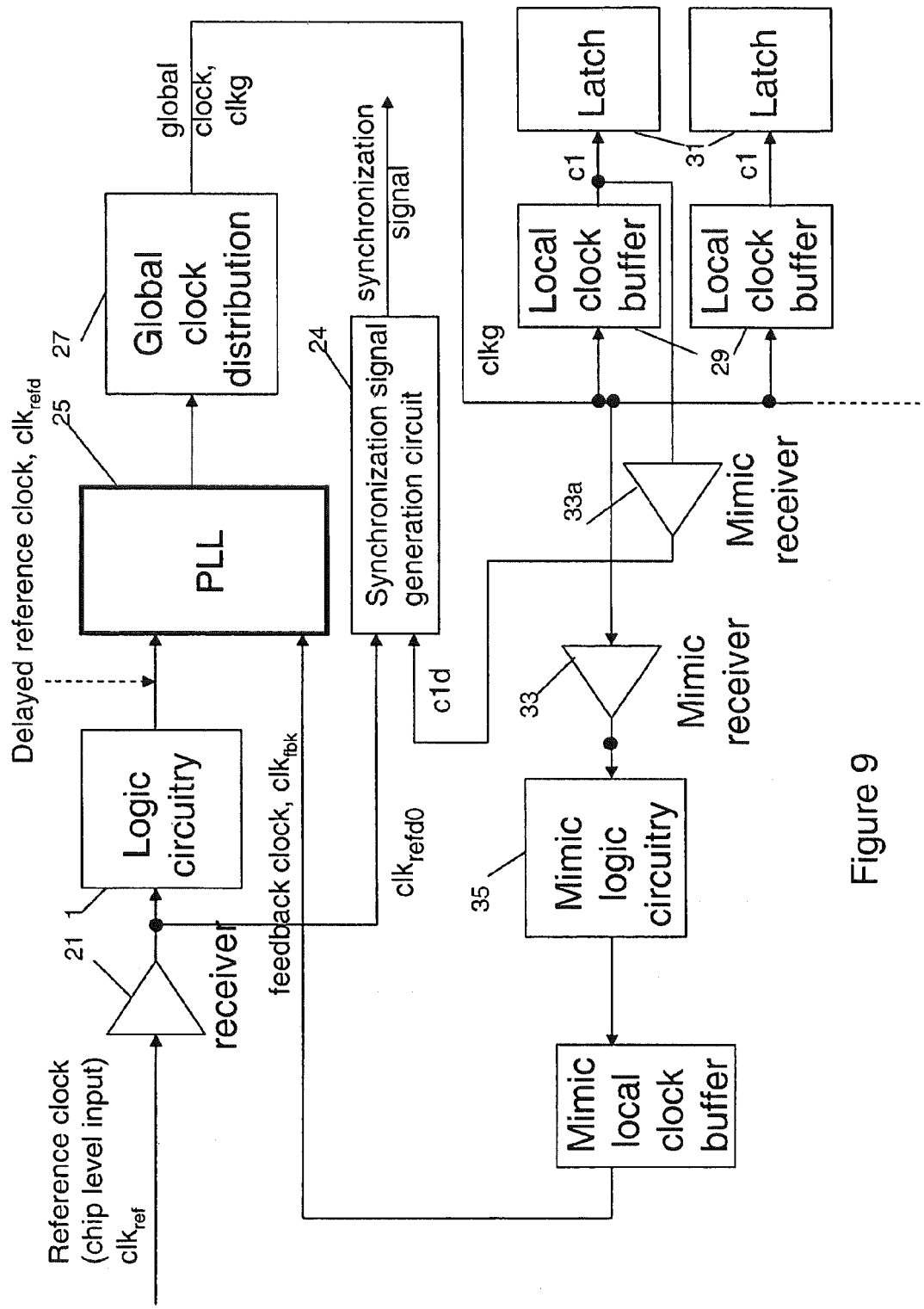
FIG. 9 illustrates one example of synchronization signal generation with a reference clock and delayed global clock at the receiver output.

To implement the scheme described in embodiment II, mimic receiver 33 should be placed near the reference clock receiver 21 to minimize the extra phase difference of the two input clocks to synchronization signal generation circuit 24 resulting from unwanted long routing. This is in general feasible because the reference clock chip input pins and receiver are placed close to the target PLL 25. In case this is not easy to achieve at chip floorplanning, a more universal way is to use a local clock buffer 29 that is driven by clkg and feed the output, cl, to a mimic receiver 33a as shown in FIG. 9. This way, the clock, cld, is generated independent of the feedback clock path, and the associated mimic receiver and local clock buffer may be placed close to reference clock receiver 21.

The synchronization signal generation circuit 24 can be an edge detection circuit. One example is shown in FIG. 10.

Figure 10:
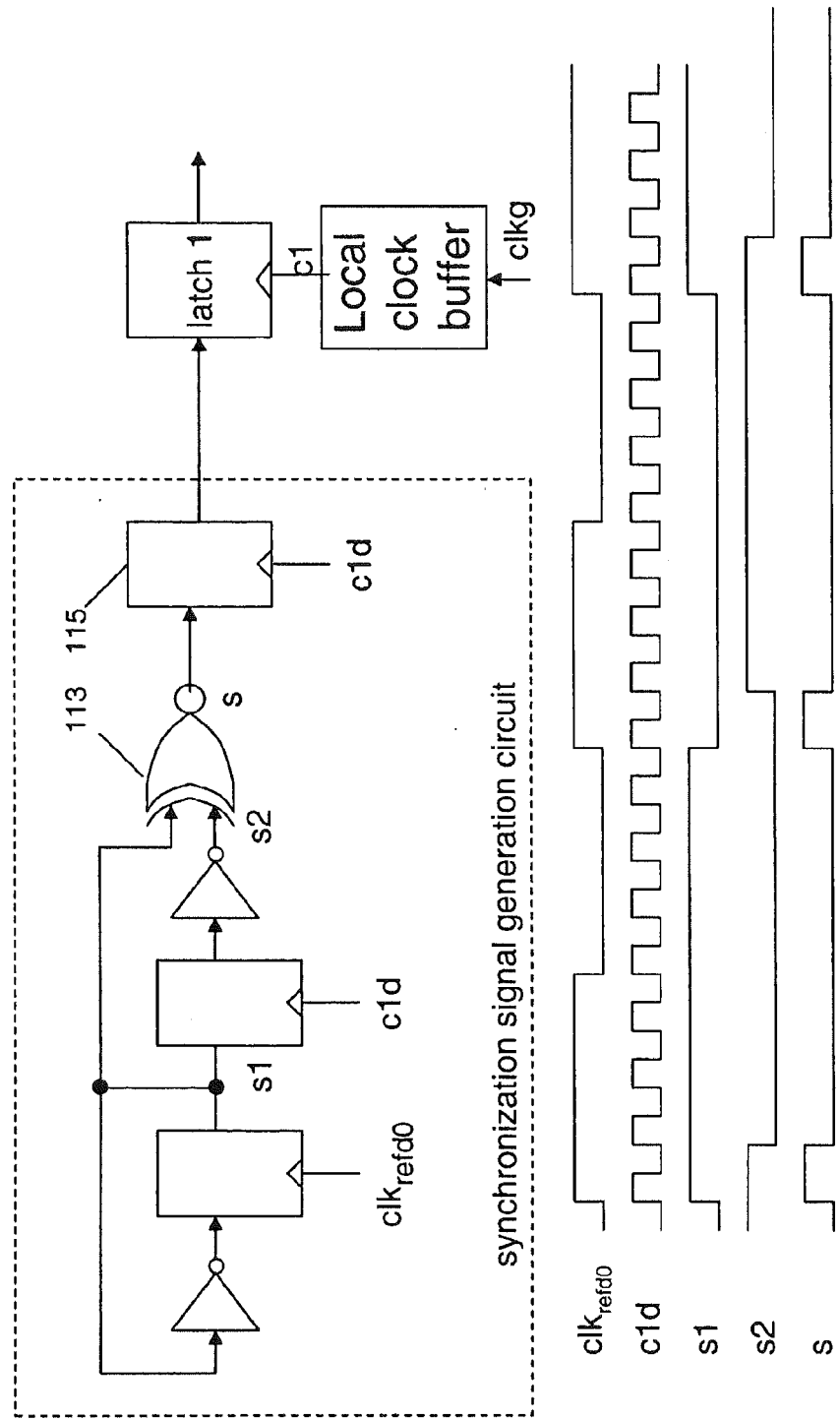
FIG. 10 illustrates one example of a synchronization signal generation circuit.

In the example shown in FIG. 10, a first latch 111 clocked by $clk_{refd0}$ is a toggle latch that generates s1, whose rising and falling edges correspond to the rising edges of $clk_{refd0}$. An XNOR gate 113 responsive to s1 and to an inverted signal s2 delayed by a full cld cycle from s1 generates the synchronization signal, s. The synchronization signal is transferred from synchronization signal generation circuit 24, which is clocked by cld, to latch 115, which is clocked by cl. There will be no timing concern as long as the delay of mimic receiver, dr, is only a portion of clkg cycle time.

Figure 11:
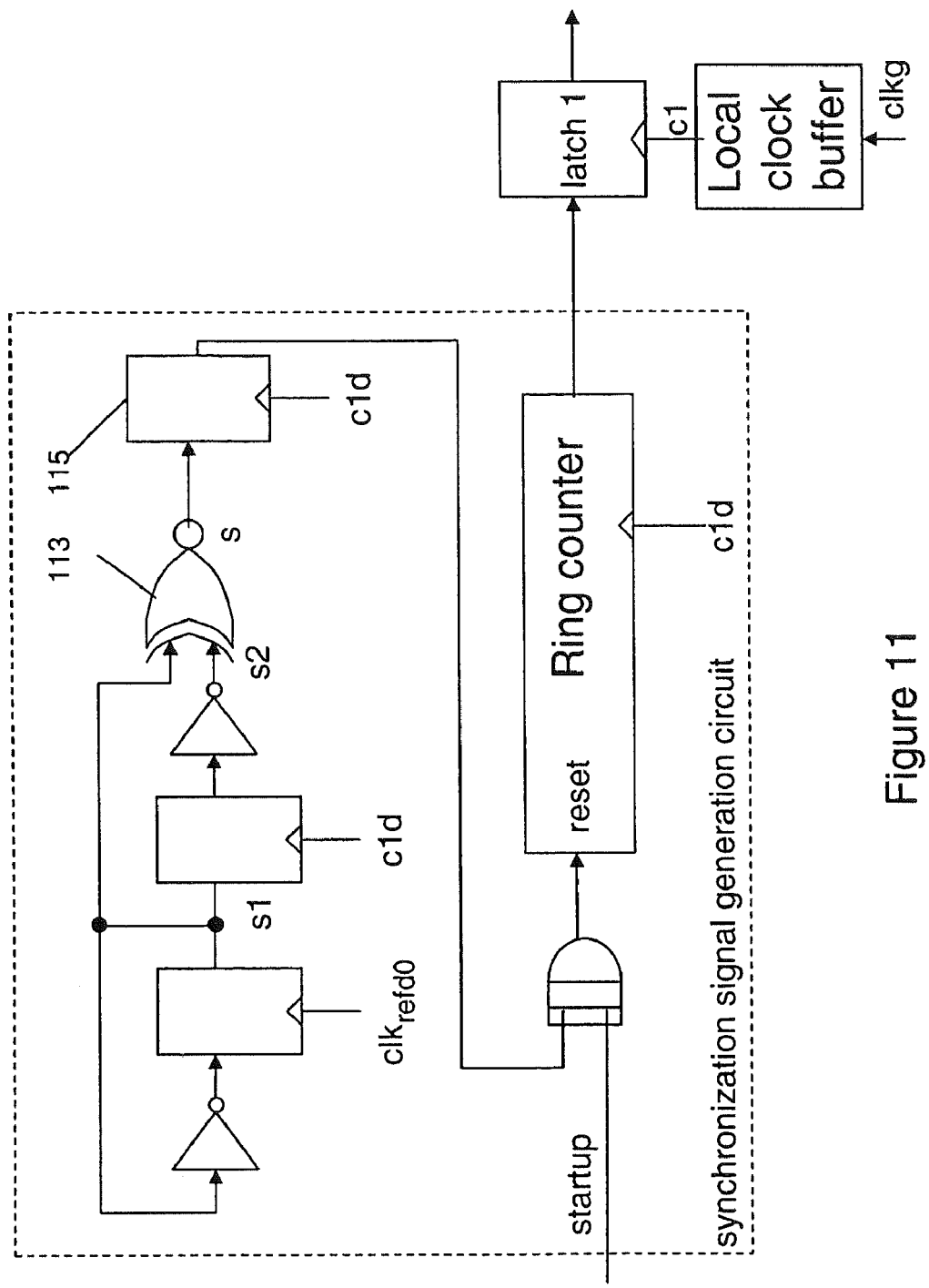
FIG. 11 illustrates one example of a free-running synchronization signal generation circuit.

In systems that may have concerns with transient clock jitter of clkg that causes large phase mismatch between $clk_{refd0}$ and clkg, which may result in a synchronization signal being temporarily incorrectly generated, one solution is to use a counter controlled by the generated synchronization signal during start up. After the startup period, the counter may be left free running FIG. 11 shows the implementation of this concept in conjunction with the synchronization signal generation circuit 24 shown in FIG. 10. The startup signal may be controlled by a service element that controls the chip operation, or it may come from any valid mode bit on the chip that clearly indicates that the chip is at startup phase.

The capabilities of the present invention can be implemented in software, firmware, hardware or some combination thereof.

As one example, one or more aspects of the present invention can be included in an article of manufacture (e.g., one or more computer program products) having, for instance, computer usable media. The media has embodied therein, for instance, computer readable program code means for providing and facilitating the capabilities of the present invention. The article of manufacture can be included as a part of a computer system or sold separately.

Additionally, at least one program storage device readable by a machine, tangibly embodying at least one program of instructions executable by the machine to perform the capabilities of the present invention can be provided.

The flow diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A clock generator circuit comprising: a chip level reference clock input, with the chip level reference clock input providing a signal to: a) logic circuitry, and b) a synchronization signal generation circuit for generating a synchronization signal, the logic circuitry having a delayed reference clock output as input with a feedback clock signal to a phase locked loop, the phase locked loop providing an input to a global clock generation circuit for generating a global clock, the global clock being an input to: c) at least one local clock buffer and latch, d) a mimic circuit feedback path including a mimic local clock buffer, one or more mimic receivers, and mimic logic circuitry; wherein an output of one of the one or more mimic receivers is input to the synchronization signal generation circuit; wherein an output of one of the one or more mimic receivers is input to the mimic logic circuitry; and wherein an output of the mimic logic circuitry is input to the phase locked loop as the feedback clock signal.

2. The clock generator circuit of claim 1 wherein one of the one or more mimic receivers and the mimic local clock buffer are at a beginning of the mimic circuit feedback path.

3. The clock generator circuit of claim 1 wherein the chip level reference clock input comprises a reference clock receiver, and wherein a delayed output of a mimic receiver and local clock buffer and an output of the reference clock receiver are used to generate the synchronization signal.

4. The clock generator circuit of claim 1 wherein the chip level reference clock input comprises a reference clock receiver, and wherein one of the one or more mimic receivers and the reference clock receiver are near enough to each other to minimize any extra phase difference of input clocks to synchronization signal generation.

5. The clock generator circuit of claim 1 wherein the one of the one or more mimic receivers that is input to the synchronization signal generation circuit is driven from a local clock buffer.

6. The clock generator circuit of claim 1 wherein the chip level reference clock input provides a signal to the synchronization signal generation circuit through the logic circuitry.

7. The clock generator circuit of claim 1 wherein an output of one of the one or more mimic receivers is input to the synchronization signal generation circuit though the mimic local clock buffer.

8. The clock generator circuit of clam 1 wherein an output of one of the one or more mimic receivers is input to the synchronization signal generation circuit though the mimic logic circuitry.

9. The clock generator circuit of clam 1 wherein the output of the mimic logic circuitry is input to the phase locked loop through the mimic local clock buffer.

10. The clock generator circuit of claim 1 wherein an output of a single mimic receiver is input to the synchronization signal generation circuit and to the mimic logic circuitry.

11. The clock generator circuit of claim 1 wherein an output of a first mimic receiver is input to the synchronization signal generation circuit and wherein an output of a second mimic receiver is input to the mimic logic circuitry.

* * * * *